US012184830B2

(12) United States Patent
Rinaldo

(10) Patent No.: US 12,184,830 B2
(45) Date of Patent: Dec. 31, 2024

(54) VEHICULAR CAMERA TESTING SYSTEM USING SPRING-LOADED ELECTRICAL CONNECTORS

(71) Applicant: Magna Electronics Inc., Auburn Hills, MI (US)

(72) Inventor: Anthony N. Rinaldo, Royal Oak, MI (US)

(73) Assignee: Magna Electronics Inc., Auburn Hills, MI (US)

( * ) Notice: Subject to any disclaimer, the term of this patent is extended or adjusted under 35 U.S.C. 154(b) by 1058 days.

(21) Appl. No.: 16/949,440

(22) Filed: Oct. 29, 2020

(65) Prior Publication Data

US 2021/0136356 A1    May 6, 2021

Related U.S. Application Data

(60) Provisional application No. 62/929,248, filed on Nov. 1, 2019.

(51) Int. Cl.
*G01R 1/067* (2006.01)
*B60R 16/03* (2006.01)
(Continued)

(52) U.S. Cl.
CPC .......... *H04N 17/002* (2013.01); *B60R 16/03* (2013.01); *G01R 1/04* (2013.01); *G01R 1/06722* (2013.01); *G07C 5/0808* (2013.01); *H01R 12/714* (2013.01); *H01R 13/2471* (2013.01); *H04N 23/50* (2023.01); *H01R 2201/20* (2013.01)

(58) Field of Classification Search
CPC .... B60R 16/03; G07C 5/0808; H01R 12/714; H01R 13/2421; H01R 13/2471; H01R 2201/20; H04N 17/002; H04N 23/50; G01R 1/04; G01R 1/0408; G01R 1/06722; G01R 31/006
See application file for complete search history.

(56) References Cited

U.S. PATENT DOCUMENTS 4,138,186 A * 2/1979 Long .................. G01R 31/00
324/754.16
5,550,677 A    8/1996 Schofield et al.
(Continued)

FOREIGN PATENT DOCUMENTS

CN    107039798    * 8/2017
KR    20140147297 A * 12/2014

*Primary Examiner* — Vinh P Nguyen
(74) *Attorney, Agent, or Firm* — HONIGMAN LLP

(57) ABSTRACT

A sensor module test system includes a sensor module for a vehicle with a housing portion, a test cover having at least one spring-loaded connector pin, and a circuit board having at least one test point. When the housing portion and the test cover are fastened together, the circuit board is disposed within a cavity within the housing portion and the test cover. With the circuit board disposed within the cavity, the spring-loaded connector pin of the test cover electrically engages the test point of the circuit board. The test cover includes an electrical connector that includes an exterior portion disposed and accessible at an exterior side of the test cover. The spring-loaded connector pin electrically connects the test point to the exterior portion of the electrical connector to provide electrical access to the test point exterior of the test cover.

18 Claims, 5 Drawing Sheets

(51) Int. Cl.
    *G01R 1/04*     (2006.01)
    *G07C 5/08*     (2006.01)
    *H01R 12/71*     (2011.01)
    *H01R 13/24*     (2006.01)
    *H04N 17/00*     (2006.01)
    *H04N 23/50*     (2023.01)

(56) References Cited

U.S. PATENT DOCUMENTS

| | | | |
|---|---|---|---|
| 5,670,935 A | 9/1997 | Schofield et al. | |
| 5,949,331 A | 9/1999 | Schofield et al. | |
| 6,066,957 A * | 5/2000 | Van Loan | G01R 1/07357 324/750.19 |
| 6,091,253 A * | 7/2000 | Huang | G01R 31/2808 324/750.25 |
| 6,690,268 B2 | 2/2004 | Schofield et al. | |
| 6,824,281 B2 | 11/2004 | Schofield et al. | |
| 6,876,530 B2 * | 4/2005 | Parker | G01R 1/07314 361/115 |
| 6,894,479 B2 * | 5/2005 | Siefers | G01R 1/0416 324/754.16 |
| 7,480,149 B2 | 1/2009 | DeWard et al. | |
| 7,965,336 B2 | 6/2011 | Bingle et al. | |
| 8,256,821 B2 | 9/2012 | Lawlor et al. | |
| 8,542,451 B2 | 9/2013 | Lu et al. | |
| 8,847,618 B1 * | 9/2014 | Michalko | G01R 31/2808 324/750.19 |
| 8,994,878 B2 | 3/2015 | Byrne et al. | |
| 9,077,098 B2 | 7/2015 | Latunski | |
| 9,233,641 B2 | 1/2016 | Sesti et al. | |
| 9,277,104 B2 | 3/2016 | Sesti et al. | |
| 9,487,159 B2 | 11/2016 | Achenbach | |
| 9,596,387 B2 | 3/2017 | Achenbach et al. | |
| 9,621,769 B2 * | 4/2017 | Mai | G03B 17/55 |
| 9,871,971 B2 | 1/2018 | Wang et al. | |
| 9,878,669 B2 | 1/2018 | Kendall | |
| 9,896,039 B2 | 2/2018 | Achenbach et al. | |
| 10,128,595 B2 | 11/2018 | Conger et al. | |
| 10,142,532 B2 | 11/2018 | Mleczko | |
| 10,230,875 B2 | 3/2019 | Mleczko et al. | |
| 10,250,004 B2 | 4/2019 | Conger et al. | |
| 10,264,219 B2 | 4/2019 | Mleczko et al. | |
| 10,272,857 B2 * | 4/2019 | Conger | B60R 11/04 |
| 10,313,572 B2 * | 6/2019 | Wöhlte | B60R 11/04 |
| 10,466,563 B2 | 11/2019 | Kendall et al. | |
| 10,506,141 B2 * | 12/2019 | Sigle | H04N 23/54 |
| 10,516,724 B2 * | 12/2019 | Takaichi | A63F 13/86 |
| 11,622,165 B2 * | 4/2023 | Sauer | B60R 1/12 348/148 |
| 2009/0244361 A1 | 10/2009 | Gebauer et al. | |
| 2009/0295181 A1 | 12/2009 | Lawlor et al. | |
| 2013/0242099 A1 | 9/2013 | Sauer et al. | |
| 2014/0160284 A1 | 6/2014 | Achenbach et al. | |
| 2014/0226012 A1 | 8/2014 | Achenbach | |
| 2014/0373345 A1 | 12/2014 | Steigerwald | |
| 2015/0015713 A1 | 1/2015 | Wang et al. | |
| 2015/0124098 A1 | 5/2015 | Winden et al. | |
| 2015/0222795 A1 | 8/2015 | Sauer et al. | |
| 2015/0266430 A1 | 9/2015 | Mleczko et al. | |
| 2015/0327398 A1 | 11/2015 | Achenbach et al. | |
| 2015/0365569 A1 | 12/2015 | Mai et al. | |
| 2016/0037028 A1 | 2/2016 | Biemer | |
| 2016/0243987 A1 | 8/2016 | Kendall | |
| 2016/0268716 A1 | 9/2016 | Conger et al. | |
| 2016/0286103 A1 | 9/2016 | Van Dan Elzen | |
| 2017/0129419 A1 | 5/2017 | Conger et al. | |
| 2017/0133811 A1 | 5/2017 | Conger et al. | |
| 2017/0201661 A1 | 7/2017 | Conger | |
| 2017/0280034 A1 | 9/2017 | Hess et al. | |
| 2017/0295306 A1 | 10/2017 | Mleczko | |
| 2017/0302829 A1 | 10/2017 | Mleczko et al. | |
| 2018/0072239 A1 | 3/2018 | Wienecke et al. | |
| 2018/0098033 A1 | 4/2018 | Mleczko et al. | |
| 2022/0019131 A1 * | 1/2022 | Moehrle | G03B 43/00 |

\* cited by examiner

VEHICULAR CAMERA TESTING SYSTEM USING SPRING-LOADED ELECTRICAL CONNECTORS

CROSS REFERENCE TO RELATED APPLICATION

The present application claims priority of U.S. provisional application Ser. No. 62/929,248, filed Nov. 1, 2019, which is hereby incorporated herein by reference in its entirety.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems is common and known. Examples of such known systems are described in U.S. Pat. Nos. 5,949,331; 5,670,935 and/or 5,550,677, which are hereby incorporated herein by reference in their entireties.

SUMMARY OF THE INVENTION

The present invention provides an electronics module testing system for an electronics module or sensor module for a vehicle, such as a camera that captures image data representative of images interior or exterior of a vehicle. The module includes a housing portion and a test cover. The housing portion includes an electrical connector that includes one or more spring-loaded connector pins. The module also includes a circuit board with one or more test points. When the housing portion and the test cover are fastened together, the circuit board is disposed within a cavity within the housing portion and the test cover. With the circuit board disposed within the cavity, the one or more spring-loaded connector pins electrically engage the one or more test points of the circuit board. The electrical connector includes an exterior portion that is disposed at and accessible at an exterior side of the test cover when the test cover is attached at the housing portion. The one or more spring-loaded connector pins electrically connect the one or more test points to the exterior portion of the electrical connector to provide electrical access to the one or more test points from exterior of the test cover.

These and other objects, advantages, purposes and features of the present invention will become apparent upon review of the following specification in conjunction with the drawings.

DESCRIPTION OF THE PREFERRED EMBODIMENTS

A vehicle vision system and/or driver assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and provide an output to a display device for displaying images representative of the captured image data. Optionally, the vision system may provide display, such as a rearview display or a top down or bird's eye or surround view display or the like.

Figure 1:
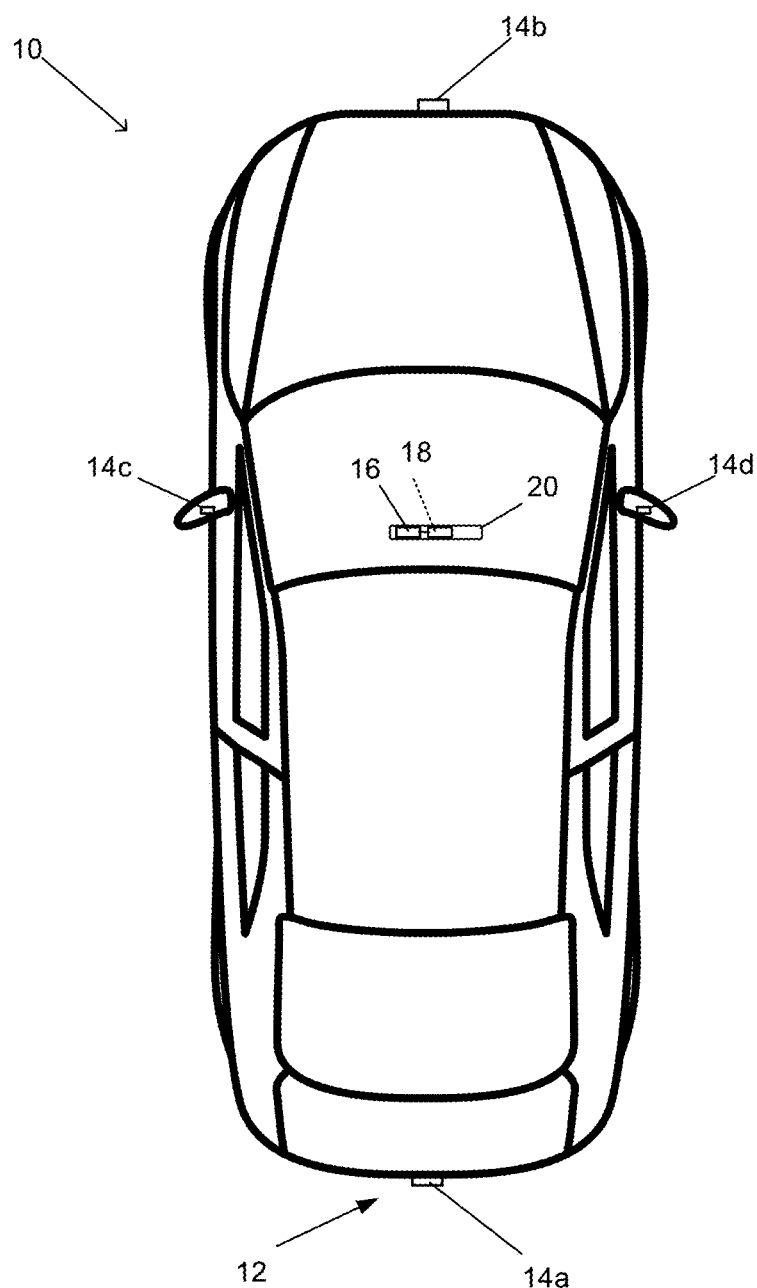
FIG. 1 is a plan view of a vehicle with a vision system that incorporates sensors such as cameras in accordance with the present invention.

Referring now to the drawings and the illustrative embodiments depicted therein, a vehicle 10 includes an imaging system or vision system 12 that includes at least one exterior viewing imaging sensor or camera, such as a rearward viewing imaging sensor or camera 14a (and the system may optionally include multiple exterior viewing imaging sensors or cameras, such as a forward viewing camera 14b at the front (or at the windshield) of the vehicle, and a sideward/rearward viewing camera 14c, 14d at respective sides of the vehicle), which captures images exterior of the vehicle, with the camera having a lens for focusing images at or onto an imaging array or imaging plane or imager of the camera (FIG. 1). Optionally, a forward viewing camera may be disposed at the windshield of the vehicle and view through the windshield and forward of the vehicle, such as for a machine vision system (such as for traffic sign recognition, headlamp control, pedestrian detection, collision avoidance, lane marker detection and/or the like). The vision system 12 includes a control or electronic control unit (ECU) 18 having electronic circuitry and associated software, with the electronic circuitry including a data processor or image processor that is operable to process image data captured by the camera or cameras, whereby the ECU may detect or determine presence of objects or the like and/or the system provide displayed images at a display device 16 for viewing by the driver of the vehicle (although shown in FIG. 1 as being part of or incorporated in or at an interior rearview mirror assembly 20 of the vehicle, the control and/or the display device may be disposed elsewhere at or in the vehicle). The data transfer or signal communication from the camera to the ECU may comprise any suitable data or communication link, such as a vehicle network bus or the like of the equipped vehicle.

During development, circuit boards of automotive modules (e.g., circuit boards of cameras or other sensors, such a radar, lidar, etc.) frequently have test connectors soldered directly to the circuit board. These test connectors electrically connect to one or more test points to provide easy access to signals propagating on the circuit board which greatly assists development and testing of the circuit card. For example, the test connector may provide access to a data bus (e.g., a serial peripheral interface (SPI) connected, via the test connector, to a protocol analyzer, JTAG connectors, etc.). The data bus can be monitored and recorded during operational testing of the circuit board.

However, once in production, the circuit boards are typically built without the test connectors and packaged within a housing to reduce cost, weight, and size of the module. When testing must be performed on a production unit, the lack of the test connector can make testing very difficult. Often, leads must be soldered to the circuit board which, in addition to being potentially difficult (and risk damage to the unit), may be complicated due to the production unit rework regulations or standards.

Figure 2:
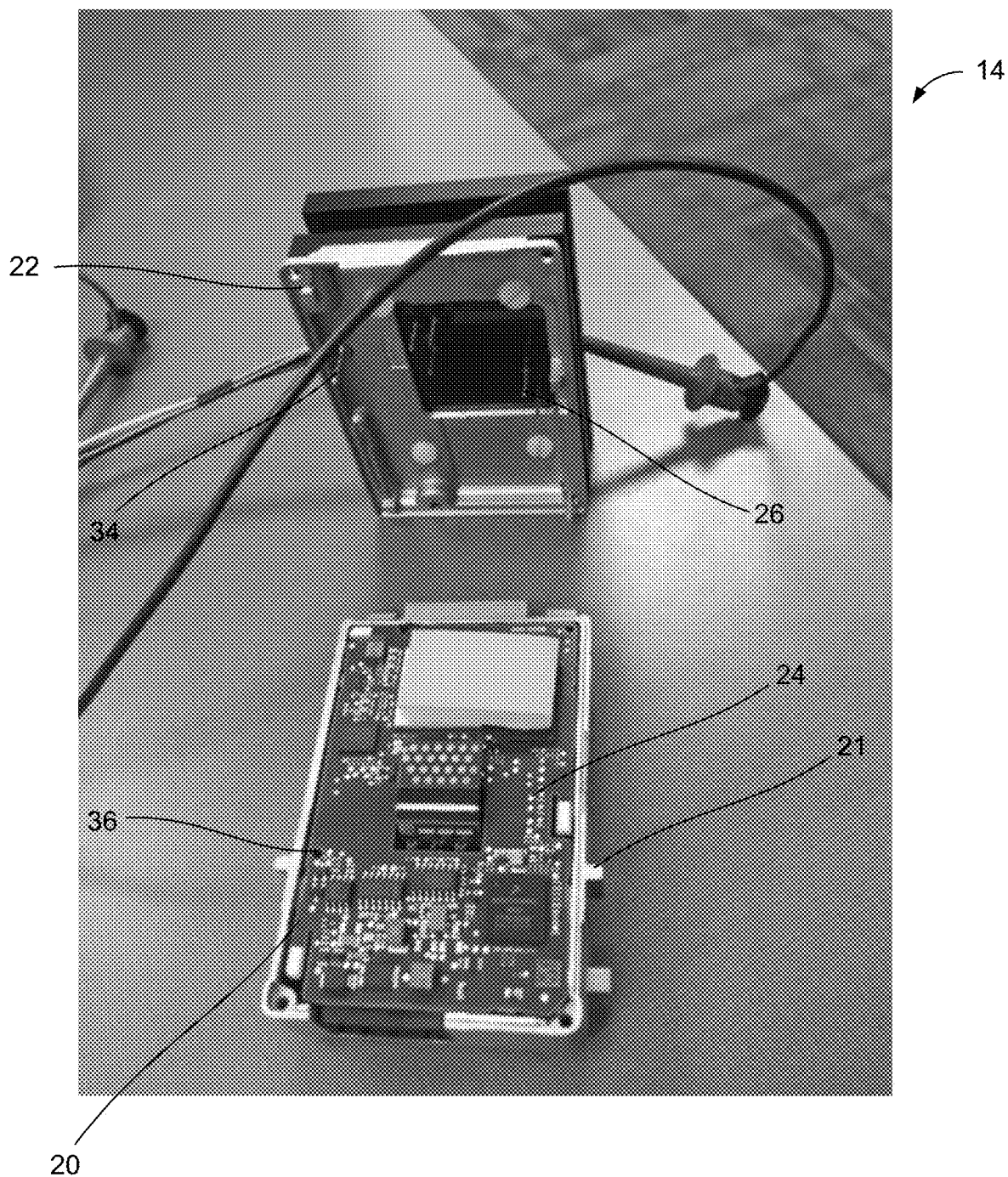
FIG. 2 is a perspective view of an internal circuit board of a camera.
Figure 3:
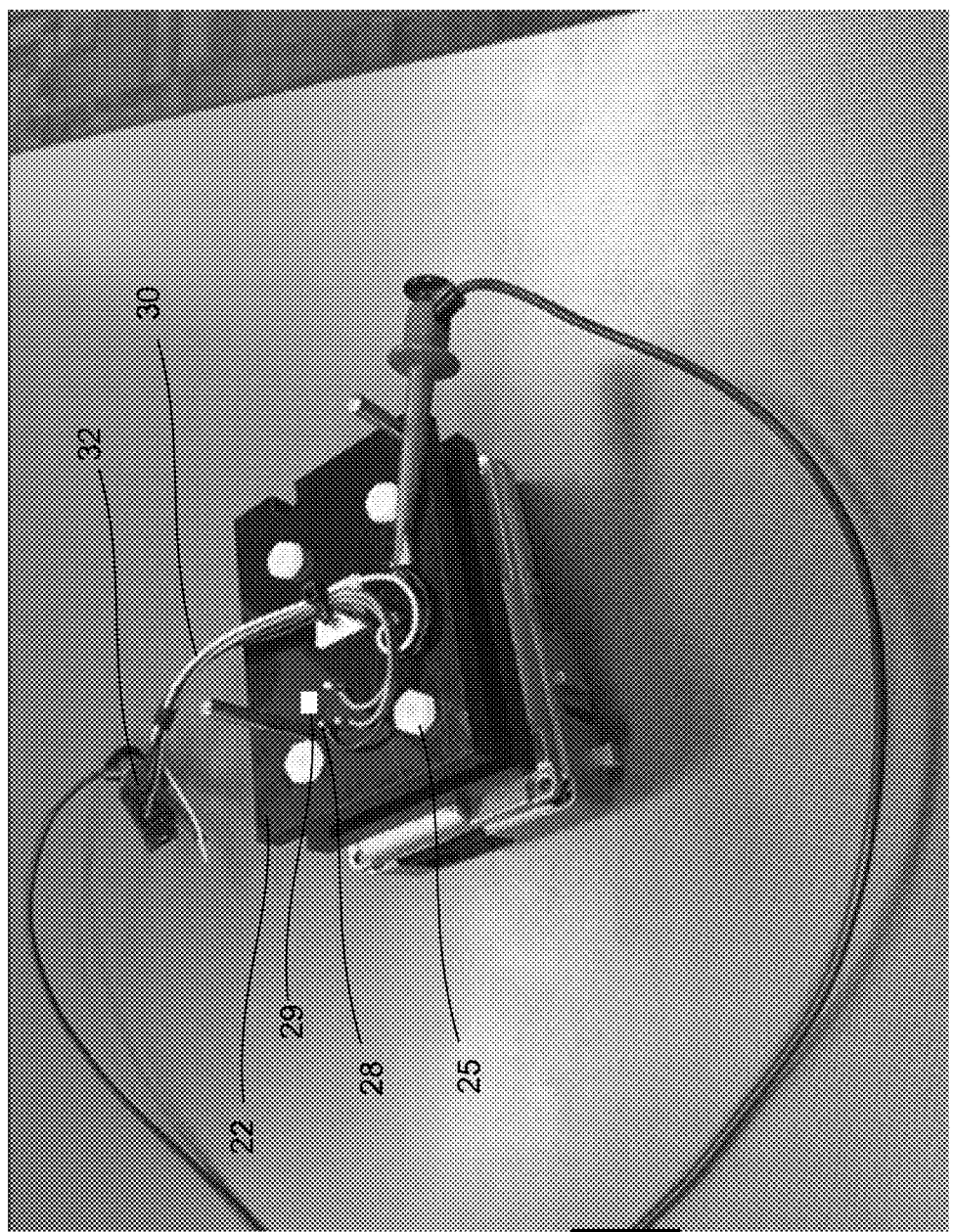
FIG. 3 is a perspective view of a camera with a modified housing in accordance with the present invention.

Referring now to FIGS. 2 and 3, implementations herein are directed towards an electronics module or sensor module test system for an electronics module 14 (e.g., a camera or other vehicular module) that includes one or more internal circuit boards 20 secured within a housing portion or first housing 21 (e.g., a lower housing or an upper housing of an accessory module, such as a camera module or other sensor module for a vehicular driving assist system or the like) and a test cover or second housing 22 (e.g., an upper housing or a lower housing or a cover). The housing portion 21 may be part of a housing of the module that is part of the assembled module as configured for use in the vehicle. The test cover 22 is detachably joined with the housing portion 21 and can be attached and detached from the housing portion 21, such as for circuit testing of the electronic circuitry of the module. Prior to such testing, the second or other housing portion may be removed or detached from the first housing portion so as to expose at least a portion of the circuit board (and electronic circuitry) within the module housing. The test cover 22 is positioned at or detachably attached at the housing portion and electrical connection with the circuitry is made, as discussed below. Thus, during the testing (e.g., at a testing station), the test cover 22 may temporarily replace a housing portion 23 (see FIG. 4) or production cover that typically attaches to the housing portion to house the internal circuit boards 20 during normal operation of the module (and does not provide access to internal test points).

The circuit board 20 includes one more electrical contact pads 24 (e.g., test points). The test points 24 may provide access to digital or analog signals propagating through the circuit board 20. For example, the test points 24 may provide access to a data bus between microprocessors or between a microprocessor and a transceiver. The signals may be dedicated test signals (e.g., test signals output from a processor, field programmable gate array (FPGA), etc.) or production signals used for operation of the module.

As illustrated in FIG. 2, the test cover 22 and/or the housing portion 21 of the test system includes one or more spring-loaded connector pins 26. In the example shown, when the test cover 22 is disposed at or attached to the housing portion 21 with the circuit board 20 disposed in the housing portion 21 and between the housing portion 21 and the test cover 22 (i.e., within a cavity formed by the housing portion 21 and the test cover 22), the spring-loaded connector pins 26 electrically engage the test points 24 at the circuit board to electrically connect the test points to an electrical connector that provides electrical access to the test points 24 from the exterior of the test cover 22 (and/or the housing portion 21).

The electrical connector and/or spring-loaded connector pins 26 may pass through the test cover 22 and provide electrical access to the test points 24 external to the housing portion 21 and test cover 22. The electrical access may be in the form of pins or leads 28 that extend from the test cover 22. The electrical access may also include electrical conducting pads 29 on the outer surface (that may be integrated in the test cover and at least partially exposed at the outer surface of the test cover and/or inner surface of the test cover. In some examples, an electrical connection between the pins 28 and an external connector 32 is established via wires 30 (FIG. 3). Thus, access to the signals of the test points 24 is provided for production units with the housing secured in place, which allows the circuit boards to remain protected during testing. During testing, signal monitors 50 may be attached to the test cover (e.g., to the electrical connector and/or exposed portions of the spring-loaded connectors) to monitor electrical signals at the one or more test points. For example, digital multimeters, oscilloscopes, bus readers, and/or any other signal monitoring tool may be used to monitor any electrical characteristics of the signals present at the one or more test points.

Figure 4:
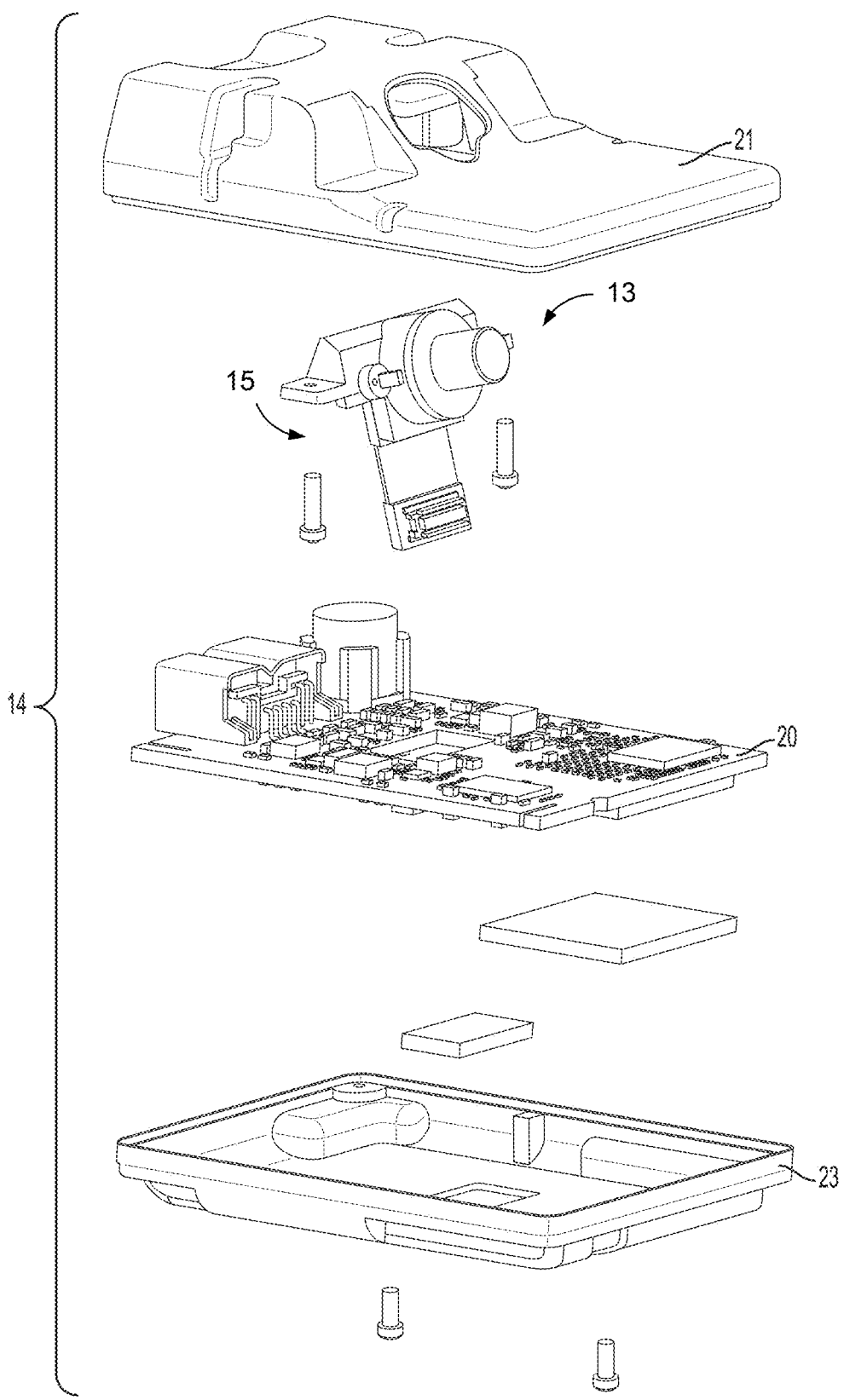
FIG. 4 is an exploded perspective view of a forward viewing windshield-mounted camera module having housing portions that encase and house a circuit board.

As shown in FIG. 4, the accessory module may comprise a windshield-mounted forward facing camera having an imager assembly 13 (including an imager 15, and imager circuit board and a flexible connector) disposed at an upper housing portion, with a primary circuit board attached at the upper housing portion (and with the flexible connector passing through a notch or slot or opening of the primary circuit board), and with a lower housing portion attached at the upper housing portion to encase or house the primary circuit board and imager circuit board within the housing of the camera module. The accessory module may utilize aspects of the camera modules described in U.S. Pat. Nos. 9,896,039; 9,871,971; 9,596,387; 9,487,159; 8,256,821; 7,480,149; 6,824,281 and/or 6,690,268, and/or U.S. Publication Nos. US-2015-0327398; US-2015-0015713; US-2014-0160284; US-2014-0226012 and/or US-2009-0295181, which are all hereby incorporated herein by reference in their entireties.

The test cover 22 (or alternatively or additionally, the housing portion 21) may be a modified or retrofitted version of the typical housing or production housing used to enclose the module 14. For example, when a production module 14 (such as a forward viewing windshield-mounted camera in FIG. 4) is to undergo testing, the standard housing (e.g., the lower housing 23 in FIG. 4) may be removed and replaced with the test cover 22, which may be installed in its place. The test cover may provide access to the test points 24 (using the spring-loaded connector pins 26) while still providing protection to the internal components of the module 14. The test cover 22 may be fastened to the housing portion 21 (e.g., the upper housing portion that supports the imager assembly of the camera module in FIG. 4) through a variety of means (e.g., screws 25, clamps, etc.). The test cover 22, the housing portion 21, and/or the circuit board 20 may include locating pins and locator holes to guide the spring-loaded connector pins 26 to the test points 24. For example, the test cover 22 may include locator pins 34 that engage locator holes 36 disposed within the circuit board 20 (FIG. 2). Although shown and described as having the test cover temporarily replace the lower housing portion, it is envisioned that the test cover may temporarily replace an upper housing portion or a side housing portion or any housing portion of an accessory module, depending on the particular application and design/construction of the accessory module under test.

Figure 5:
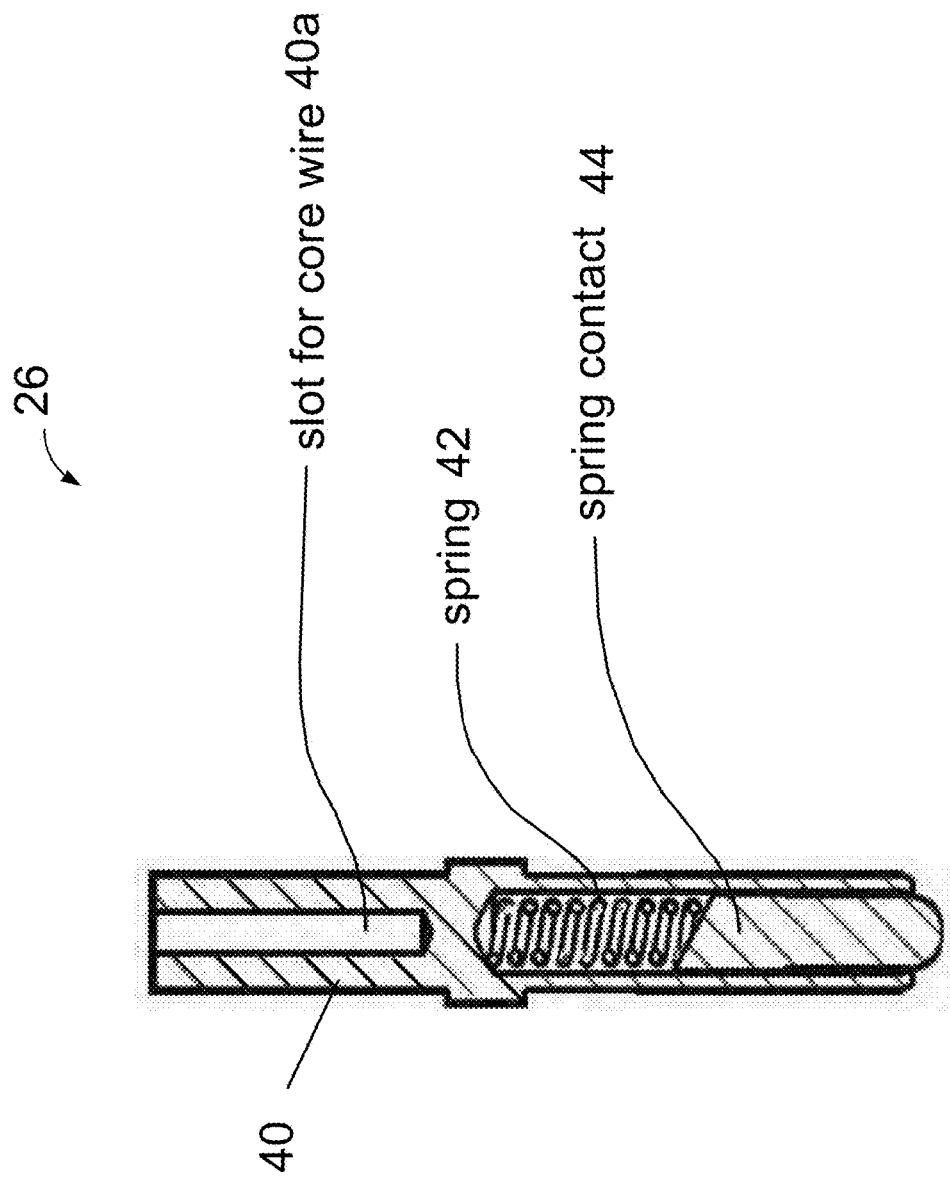
FIG. 5 is a plan view of a spring-loaded connector in accordance with the present invention.

Referring now to FIG. 5, the spring-loaded electrically conductive connector pin 26 may include a body portion 40 having a slot 40a for a core wire, a spring 42, and a spring contact 44. The body portion, spring and spring contact comprise electrically conductive material. The spring biases the spring contact 44 against an electrically conductive contact and electrically connects the core wire and the spring contact. The spring-loaded electrically conductive connector pins 26 may utilize aspects described in U.S. Pat. Nos.

10,466,563; 10,264,219; 10,128,595 and/or 9,878,669, which are hereby incorporated herein by reference in their entireties.

Thus, implementations herein provide a housing or cover for a module that includes one or more spring-loaded electrically conductive connector pins. The spring-loaded electrically conductive connector pins, when the housing is installed at the module, electrically connect to one or more test points of a circuit board internal to the module. The spring-loaded connector pins provide external access to internal signals of the circuit board without the need of installing (i.e., soldering) a connector or wires directly to the circuit board. The cover or module may be a modified cover or housing that may be temporarily swapped with a production cover to allow testing without the need to overly expose or modify circuit card components. The single modified cover may be reused frequently such that a single modified cover may allow for testing of any number of production modules without the need of dedicated testing hardware installed on the circuit cards or within the modules. While examples herein illustrate the module as a camera, it is understood that any module that includes an internal circuit board is within the scope of the invention.

The vehicle may include any type of sensor or sensors, such as imaging sensors or radar sensors or lidar sensors or ultrasonic sensors or the like. The imaging sensor or camera may capture image data for image processing and may comprise any suitable camera or sensing device, such as, for example, a two dimensional array of a plurality of photosensor elements arranged in at least 640 columns and 480 rows (at least a 640×480 imaging array, such as a megapixel imaging array or the like), with a respective lens focusing images onto respective portions of the array. The photosensor array may comprise a plurality of photosensor elements arranged in a photosensor array having rows and columns. Preferably, the imaging array has at least 300,000 photosensor elements or pixels, more preferably at least 500,000 photosensor elements or pixels and more preferably at least 1 million photosensor elements or pixels. The imaging array may capture color image data, such as via spectral filtering at the array, such as via an RGB (red, green and blue) filter or via a red/red complement filter or such as via an RCC (red, clear, clear) filter or the like. The logic and control circuit of the imaging sensor may function in any known manner, and the image processing and algorithmic processing may comprise any suitable means for processing the images and/or image data.

For example, the vision system and/or processing and/or camera and/or circuitry may utilize aspects described in U.S. Pat. Nos. 9,233,641; 9,146,898; 9,174,574; 9,090,234; 9,077,098; 8,818,042; 8,886,401; 9,077,962; 9,068,390; 9,140,789; 9,092,986; 9,205,776; 8,917,169; 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or U.S. Publication Nos. US-2014-0340510; US-2014-0313339; US-2014-0347486; US-2014-0320658; US-2014-0336876; US-2014-0307095; US-2014-0327774; US-2014-0327772; US-2014-0320636; US-2014-0293057; US-2014-0309884; US-2014-0226012; US-2014-0293042; US-2014-0218535; US-2014-0218535; US-2014-0247354; US-2014-0247355; US-2014-0247352; US-2014-0232869; US-2014-0211009; US-2014-0160276; US-2014-0168437; US-2014-0168415; US-2014-0160291; US-2014-0152825; US-2014-0139676; US-2014-0138140; US-2014-0104426; US-2014-0098229; US-2014-0085472; US-2014-0067206; US-2014-0049646; US-2014-0052340; US-2014-0025240; US-2014-0028852; US-2014-005907; US-2013-0314503; US-2013-0298866; US-2013-0222593; US-2013-0300869; US-2013-0278769; US-2013-0258077; US-2013-0258077; US-2013-0242099; US-2013-0215271; US-2013-0141578 and/or US-2013-0002873, which are all hereby incorporated herein by reference in their entireties. The system may communicate with other communication systems via any suitable means, such as by utilizing aspects of the systems described in U.S. Pat. Nos. 10,071,687; 9,900,490; 9,126,525 and/or 9,036,026, which are hereby incorporated herein by reference in their entireties.

The camera assembly or module may utilize aspects of the cameras and connectors described in U.S. Pat. Nos. 10,272,857; 10,250,004; 10,230,875; 10,142,532; 9,621,769; 9,277,104; 9,077,098; 8,994,878; 8,542,451 and/or 7,965,336, and/or U.S. Publication Nos. US-2009-0244361; US-2013-0242099; US-2014-0373345; US-2015-0124098; US-2015-0222795; US-2015-0327398; US-2016-0243987; US-2016-0268716; US-2016-0286103; US-2016-0037028; US-2017-0129419; US-2017-0133811; US-2017-0201661; US-2017-0280034; US-2017-0295306 and/or US-2018-0098033, which are hereby incorporated herein by reference in their entireties.

The camera may include electrical connecting elements that accommodate tolerances in the housing and/or PCB mounting and/or connector portion. The electrical connecting elements may utilize aspects of the cameras and electrical connectors described in U.S. Pat. No. 9,233,641 and/or U.S. Publication Nos. US-2013-0242099; US-2014-0373345; US-2015-0222795; US-2015-0266430; US-2015-0365569; US-2016-0037028; US-2016-0268716; US-2017-0133811; US-2017-0295306 and/or US-2017-0302829, which are hereby incorporated herein by reference in their entireties. Optionally, the electrical connections may be established via molded interconnect device (MID) technology, such as by utilizing aspects of the cameras described in U.S. Publication Nos. US-2018-0072239; US-2017-0295306 and/or US-2016-0037028, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A sensor module test system for a vehicle, said sensor module test system comprising:
    a sensor module comprising (i) a first housing portion that houses a circuit board having electronic circuitry and (ii) a second housing portion detachably attaches with the first housing portion to form a first cavity around the circuit board, wherein the electronic circuitry comprises at least one test point, and wherein the first housing portion and the second housing portion are parts of a housing of the sensor module that is part of an assembled sensor module configured for use in the vehicle;
    a test cover comprising an electrical connector, wherein the electrical connector comprises at least one spring-loaded electrically conductive connector pin;
    wherein, when (i) the second housing portion is detached from the first housing portion and (ii) the test cover is attached at the first housing portion, the circuit board is disposed within a second cavity formed by the test cover and the first housing portion;

wherein, with the circuit board disposed within the second cavity, the at least one spring-loaded electrically conductive connector pin of the test cover engages the at least one test point of the circuit board;

wherein the electrical connector comprises an exterior portion that is disposed at and accessible at an exterior side of the test cover when the test cover is attached at the first housing portion;

wherein the at least one spring-loaded electrically conductive connector pin electrically connects the at least one test point to the exterior portion of the electrical connector to provide electrical access to the at least one test point from exterior of the test cover; and wherein the exterior portion of the electrical connector comprises at least one electrically conductive pad, and wherein the at least one spring-loaded electrically conductive connector pin electrically connects to the at least one electrically conductive pad.

2. The sensor module test system of claim 1, wherein the exterior portion of the electrical connector comprises an outer end of the at least one spring-loaded electrically conductive connector pin, and wherein the at least one spring-loaded electrically conductive connector pin extends through the test cover to provide the electrical access to the at least one test point exterior of the test cover.

3. The sensor module test system of claim 1, wherein the at least one electrically conductive pad is integrated in the test cover at an outer surface of the test cover.

4. The sensor module test system of claim 1, wherein the test cover is fastened to the first housing portion via screws.

5. The sensor module test system of claim 1, wherein the at least one test point provides access to digital or analog electrical signals.

6. The sensor module test system of claim 1, wherein the test cover comprises at least one external electrically conductive pin, the at least one external electrically conductive pin electrically connected to the at least one spring-loaded electrically conductive connector pin.

7. The sensor module test system of claim 6, wherein the at least one external electrically conductive pin is electrically connected to a connector.

8. The sensor module test system of claim 6, wherein the at least one spring-loaded electrically conductive connector pin passes through the test cover to electrically connect to the at least one external electrically conductive pin.

9. The sensor module test system of claim 1, wherein the test cover comprises locator pins and the circuit board comprises locator holes, and wherein the locator pins engage the locator holes when the test cover is attached at the first housing portion.

10. The sensor module test system of claim 1, wherein the sensor module comprises a camera module, and wherein the electronic circuitry of the circuit board is associated with an imager of the camera module.

11. The sensor module test system of claim 1, wherein the test cover comprises a modified housing portion that replaces the second housing portion of the sensor module when testing the sensor module via the sensor module test system.

12. A method for testing a sensor module, the method comprising:

providing the sensor module for testing, wherein the sensor module comprises a first housing and a second housing, and wherein the first housing and the second housing detachably attach to form a cavity, and wherein a circuit board is disposed within the cavity, and wherein the circuit board comprises electronic circuitry that includes one or more test points, and wherein the first housing and the second housing are part of a housing of the sensor module that is part of an assembled sensor module configured for use in a vehicle;

detaching and removing the second housing from the first housing to expose the circuit board;

attaching a test cover to the first housing, wherein the test cover is different from the second housing, and wherein the test cover and the first housing form a second cavity with the circuit board disposed within the second cavity, and wherein the test cover comprises an electrical connector having (i) an exterior portion that is disposed at and accessible at an exterior side of the test cover when the test cover is attached at the first housing and (ii) one or more spring-loaded electrically conductive connector pins that engage the one or more test points of the circuit board;

wherein the exterior portion comprises one or more electrically conductive pads, and wherein the one or more spring-loaded electrically conductive connector pins electrically connect to the one or more electrically conductive pads;

wherein attaching the test cover to the first housing comprises electrically connecting the one or more spring-loaded electrically conductive connector pins to the one or more test points to electrically connect the one or more test points to the one or more electrically conductive pads of the exterior portion of the electrical connector; and attaching one or more signal monitors to the exterior portion of the electrical connector to monitor electrical characteristics of electrical signals at the one or more test points.

13. The method of claim 12, wherein the exterior portion of the electrical connector comprises an outer end of the one or more spring-loaded electrically conductive connector pins, and wherein the one or more spring-loaded electrically conductive connector pins extend through the test cover to provide electrical access to the one or more test points exterior of the test cover, and wherein the signal monitors attach to the spring-loaded electrically conductive connector pins.

14. The method of claim 12, wherein the test cover comprises locator pins and the circuit board comprises locator holes, and wherein attaching the test cover to the first housing comprises engaging the locator pins with the locator holes to align the one or more spring-loaded electrically conductive connector pins with the one or more test points.

15. The method of claim 12, wherein the sensor module comprises a camera module, and wherein the electronic circuitry of the circuit board is associated with an imager of the camera module.

16. A sensor module test system for a vehicle, said sensor module test system comprising:

a sensor module comprising (i) a first housing portion that houses a circuit board having electronic circuitry and (ii) a second housing portion detachably attaches with the first housing portion to form a first cavity around the circuit board, wherein the electronic circuitry comprises a plurality of test points, and wherein the first housing portion and the second housing portion are parts of a housing of the sensor module that is part of an assembled sensor module configured for use in the vehicle;

a test cover comprising an electrical connector, wherein the electrical connector comprises a plurality of spring-loaded electrically conductive connector pins;

wherein, when (i) the second housing portion is detached from the first housing portion and (ii) the test cover is attached at the first housing portion, the circuit board is disposed within a second cavity formed by the test cover and the first housing portion;

wherein, with the circuit board disposed within the second cavity, each of the plurality of spring-loaded electrically conductive connector pins of the test cover engages a respective one of the plurality of test points of the circuit board;

wherein the electrical connector comprises an exterior portion that is disposed at and accessible at an exterior side of the test cover when the test cover is attached at the first housing portion;

wherein each of the plurality of spring-loaded electrically conductive connector pins electrically connect to the respective one of the plurality of test points to the exterior portion of the electrical connector to provide electrical access to the one of the plurality of test points from exterior of the test cover; and wherein the exterior portion of the electrical connector comprises a plurality of electrically conductive pads, and wherein individual pins of the plurality of spring-loaded electrically conductive connector pins electrically connect to respective individual pads of the plurality of electrically conductive pads.

17. The sensor module test system of claim 16, wherein the test cover comprises locator pins and the circuit board comprises locator holes, and wherein the locator pins engage the locator holes when the test cover is attached at the first housing portion.

18. The sensor module test system of claim 16, wherein the sensor module comprises a camera module, and wherein the electronic circuitry of the circuit board is associated with an imager of the camera module.

* * * * *